United States Patent
Heiss et al.

(10) Patent No.: US 11,099,247 B2
(45) Date of Patent: Aug. 24, 2021

(54) ULTRA-LOW VIBRATION CRYOGEN-FREE CRYOSTAT FOR AN ELECTRON PARAMAGNETIC RESONANCE SYSTEM

(75) Inventors: Arthur H Heiss, Brookfield, CT (US); Ajay Khatri, Bethleham, PA (US)

(73) Assignee: Bruker Biospin Corporation, Billerica, MA (US)

( * ) Notice: Subject to any disclaimer, the term of this patent is extended or adjusted under 35 U.S.C. 154(b) by 0 days.

(21) Appl. No.: 13/359,633

(22) Filed: Jan. 27, 2012

(65) Prior Publication Data

US 2013/0192274 A1 Aug. 1, 2013

(51) Int. Cl.
*F25B 19/00* (2006.01)
*G01R 33/30* (2006.01)
*G01R 33/60* (2006.01)

(52) U.S. Cl.
CPC .............. *G01R 33/30* (2013.01); *G01R 33/60* (2013.01)

(58) Field of Classification Search
CPC .......... F17C 3/085; F17C 13/007; F17C 5/02; F17C 7/02; F17C 9/00; F17C 2205/0323; F17C 2227/0337; F17C 13/006; F25D 19/006
USPC ................................. 62/51.1, 50.1
See application file for complete search history.

(56) References Cited

U.S. PATENT DOCUMENTS

| | | | |
|---|---|---|---|
| 4,930,318 A * | 6/1990 | Brzozowski | F25D 19/006 250/352 |
| 5,537,829 A | 7/1996 | Jones et al. | |
| 5,584,184 A * | 12/1996 | Inaguchi | F25B 9/14 62/51.1 |
| 5,611,207 A * | 3/1997 | Hess | B01L 1/02 62/298 |
| 5,884,489 A * | 3/1999 | Retz | H01F 6/065 335/216 |
| 6,396,377 B1 | 5/2002 | Ying | |
| 7,586,305 B2 | 9/2009 | Hofer | |
| 8,307,666 B2 * | 11/2012 | Woidtke | F16J 15/02 62/383 |

(Continued)

FOREIGN PATENT DOCUMENTS

| JP | 04295782 | 10/1992 |
|---|---|---|
| JP | 2005172597 A | 6/2005 |

OTHER PUBLICATIONS

Perlson, B.D. and Weil J. A., Variable low temperature EPR cavity, The eview of Scientific Instruments, vol. 46, No. 7, pp. 874-878 Jul. 1975.

(Continued)

*Primary Examiner* — Jianying C Atkisson
*Assistant Examiner* — Meraj A Shaikh

(57) ABSTRACT

A closed cycle cryocooler is thermally connected to an elongated, cup-shaped sample well and cools down the sample well. Gaseous helium at a relatively low pressure is introduced into the sample well so that, as the sample well is cooled by the cryocooler, the gas in the sample well is also cooled. A sample is attached to a sample stick assembly which is then lowered into the sample well where the sample is cooled by the cooled gas to carryout experiments at low temperature. The sample stick assembly is mechanically attached to the spectrometer magnets and a flexible rubber bellows connects the sample stick assembly to the sample well so that vibration generated by the cryocooler is not transferred to the sample.

15 Claims, 4 Drawing Sheets

(56) References Cited

U.S. PATENT DOCUMENTS

| | | | |
|---|---|---|---|
| 2004/0074240 A1* | 4/2004 | Robbie | F17C 7/02 |
| | | | 62/50.1 |
| 2007/0107445 A1 | 5/2007 | Boesel et al. | |
| 2007/0173715 A1* | 7/2007 | Jonas | F25D 19/006 |
| | | | 600/410 |
| 2010/0127148 A1* | 5/2010 | Woidtke | F25D 19/006 |
| | | | 248/636 |
| 2010/0186425 A1 | 7/2010 | Veprik | |
| 2011/0005239 A1 | 1/2011 | Khatri | |

OTHER PUBLICATIONS

Weil J. A. and Schindler P., Variable Temperature EPR Cryostat Cavity, The Review of Scientific Instruments, vol. 38, No. 5, pp. 659-660 May 1961.
JP office action for JP2013-011830 dated Nov. 29, 2016.
Wang et al., "The Design of Cryogen-Free Cryostat for Pulsed High Magnetic Field Based on GM Cryocooler", IEEE Transactions on Applied Superconductivity, vol. 22, No. 3, Jun. 2012.
Huang et al., "System for electron paramagnetic resonance measurements at high pressure and low temperature", Rev. Sci. Instrum., 68 (10), Oct. 1997.

\* cited by examiner

ULTRA-LOW VIBRATION CRYOGEN-FREE CRYOSTAT FOR AN ELECTRON PARAMAGNETIC RESONANCE SYSTEM

BACKGROUND

Electron paramagnetic resonance (EPR) or electron spin resonance (ESR) spectroscopy is a technique for studying chemical species that have one or more unpaired electrons, such as organic and inorganic free radicals or inorganic complexes that include a transition metal ion. According to quantum theory, an electron has a spin which can be understood as an angular momentum that produces a magnetic moment. If the electron is placed in a magnetic field the magnetic moment will tend to align with the magnetic field. However due to quantum effects, the electron can only have two states: one with the magnetic moment aligned parallel to the applied field and a second with the magnetic moment aligned anti-parallel to the field. Each of these two states has a different energy level. If electromagnetic radiation is applied at a frequency that corresponds to the separation between the two energy levels, energy is absorbed from the electromagnetic field and this absorption can be measured. An EPR spectrum can be produced by varying either the electromagnetic radiation frequency or the applied magnetic field strength and measuring the energy absorption. In practice, the latter is generally varied.

Because most stable molecules have all their electrons paired, the EPR phenomenon is not generally observable in those molecules. Some molecules, known as paramagnetic molecules, have an odd number of electrons, which obviously cannot be paired. It is these molecules that are commonly studied via EPR techniques. This limitation to paramagnetic species also means that the EPR technique is one of great specificity, since ordinary chemical solvents and matrices do not give rise to EPR spectra.

In many EPR experiments, it is either advantageous or necessary to measure the EPR sample at greatly reduced temperatures (4-10K). The advantages of operating at low temperature include an increase in signal levels from samples where relaxation times are very short at room temperature and the ability to study phase transitions.

There are several methods for cooling a sample to the range of several degrees Kelvin. The most widely used method is to immerse the sample in a bath of liquid helium or to place the sample in a sample well where it is immersed in vapor flowing from evaporation of the liquid helium. However, this method has several drawbacks. Liquid helium itself is relatively expensive and, if the liquid helium must be shipped to the work site, there is inevitably some loss of liquid helium due to boil-off, making the liquid helium even more expensive. Further, as the helium evaporates, the gas is generally vented to the atmosphere from the top of the sample well and lost so that typical experiments use several liters of liquid helium each. Since helium boil-off is continuous, it is not economical to allow the EPR apparatus to remain at low temperature between experiments, thus experiments must be conducted as rapidly as possible and scheduled together to conserve helium. In any case, the helium must be replenished every few hours of operation and thus long term experiments are not possible.

In order to overcome these difficulties, systems have been developed that do not use liquid helium. These systems generally use a closed-cycle refrigerator, such as a conventional Gifford-McMahon (GM) refrigerator or a pulse tube refrigerator to cool a metal "cold head" to the required temperature. The sample to be cooled is mounted on the cold head and cooled by direct conduction. These systems also have drawbacks. First, since the sample is mechanically connected to the cold head, any vibrations produced by the refrigeration mechanism are transferred to the sample. These vibrations are typically on the order of 1-2 hertz and typically do not cause problems with pulsed EPR experiments because the pulse time is much shorter than the vibration cycle time. However, the vibrations can cause problems with continuous EPR experiments. Second, in order to insulate the cold head and the sample, these latter elements are typically enclosed in a housing which is evacuated. Therefore, the cold head must be brought to a raised temperature and the housing must be vented prior to changing the sample. After the sample has been changed, the housing must be evacuated and the cold head brought down to the correct temperature, both of which are time-consuming operations.

SUMMARY

In accordance with the principles of the invention, a closed cycle cryocooler is thermally connected to an elongated, cup-shaped sample well and cools down the sample well. Gaseous helium at a relatively low pressure is introduced into the sample well so that, as the sample well is cooled by the cryocooler, the gas in the sample well is also cooled. A sample is attached to a sample stick assembly which is then lowered into the sample well where the sample is cooled by the cooled gas to carryout experiments at low temperature. The sample stick assembly is mechanically attached to the spectrometer magnets and a flexible rubber bellows connects the sample stick assembly to the sample well so that vibration generated by the cryocooler is not transferred to the sample.

In one embodiment, the sample well is contained in a tubular vacuum shroud that extends perpendicularly to the cold head of the cryocooler, thereby allowing the sample well to operate with a narrow spacing between the poles of a conventional electron paramagnetic resonance spectrometer.

In another embodiment, a thermal radiation shield is integrated with the sample well assembly and extends between the magnet poles.

DETAILED DESCRIPTION

Figure 1B:
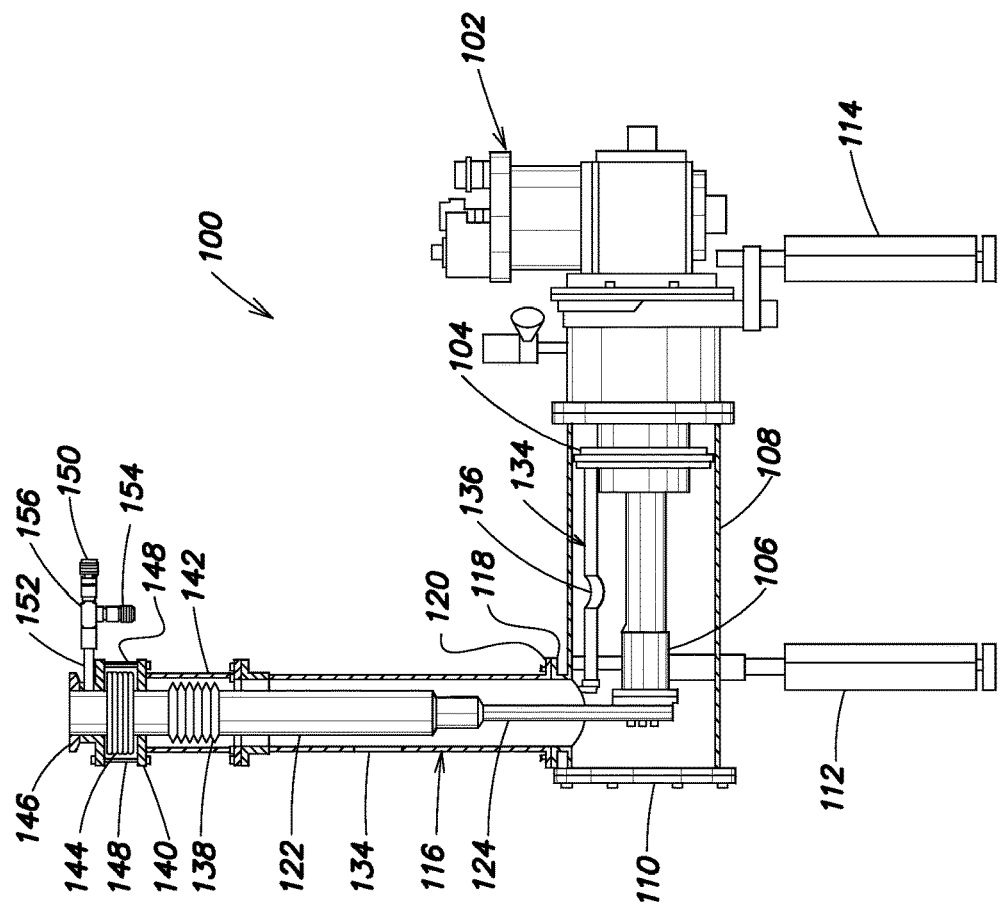
FIG. 1B is a side view of the cryostat assembly shown in FIG. 1A.
Figure 1A:
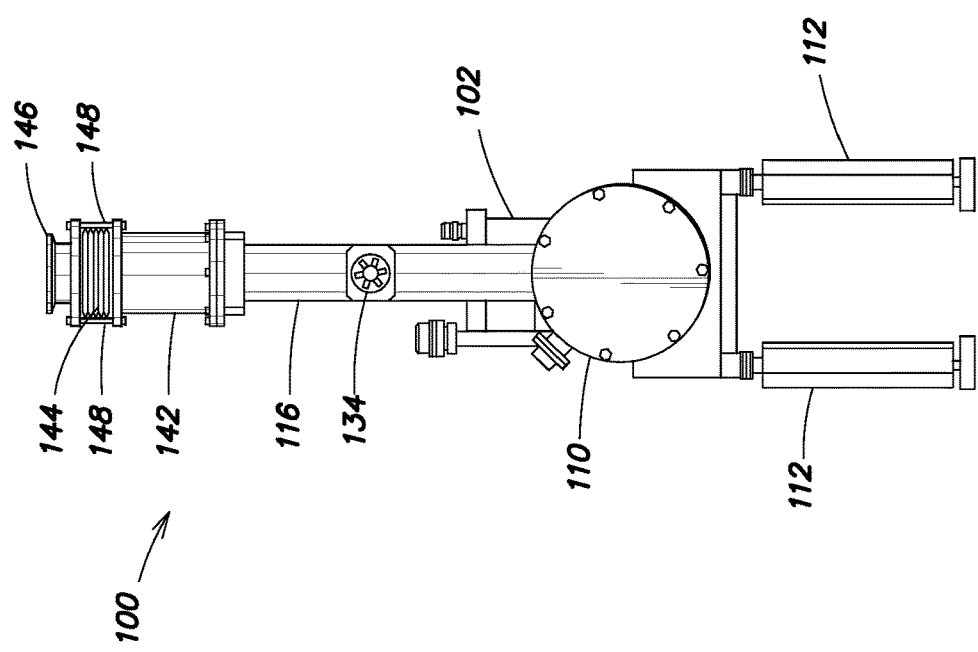
FIG. 1A is an end view of a cryostat assembly constructed in accordance with the principles of the invention.

FIGS. 1A and 1B show end and side views of a cryostat constructed in accordance with the principles of the invention. The cryostat 100 is cooled by a closed cycle cryocooler 102, which has a first stage 104 and a second stage or cold head 106. The cryocooler 102 is a conventional closed-cycle refrigerator, such as a conventional Gifford-McMahon (GM) refrigerator or a pulse tube refrigerator that cools cold head 106 to a temperature of approximately 10K. A cryocooler suitable for use with the invention is a model RDK 408D2 manufactured and sold by Sumitomo Cryogenics of America, Inc. 1833 Vultee Street Allentown, Pa. 18103-4783.

The first stage 104 and the second stage 106 of the cryocooler are enclosed in a vacuum shroud 108 which reduces convective heat transfer. Shroud 108 is closed by an end plate 110 which is bolted to the shroud 108. Next to the inner surface of shroud 108 is a conventional cylindrical thermal radiation shield (not shown in FIGS. 1A and 1B for clarity) which is mounted on, and thermally connected to, cryocooler first stage 104. The radiation shield extends close to end plate 110 without physically touching it, where the radiation shield is closed by a circular end plate. This radiation shield reduces heat transfer due to thermal radiation. The entire cryostat structure rests on adjustable support structures 112 and 114 which can be adjusted to vertically position the cryostat between the EPR magnets, as discussed below.

Figure 2:
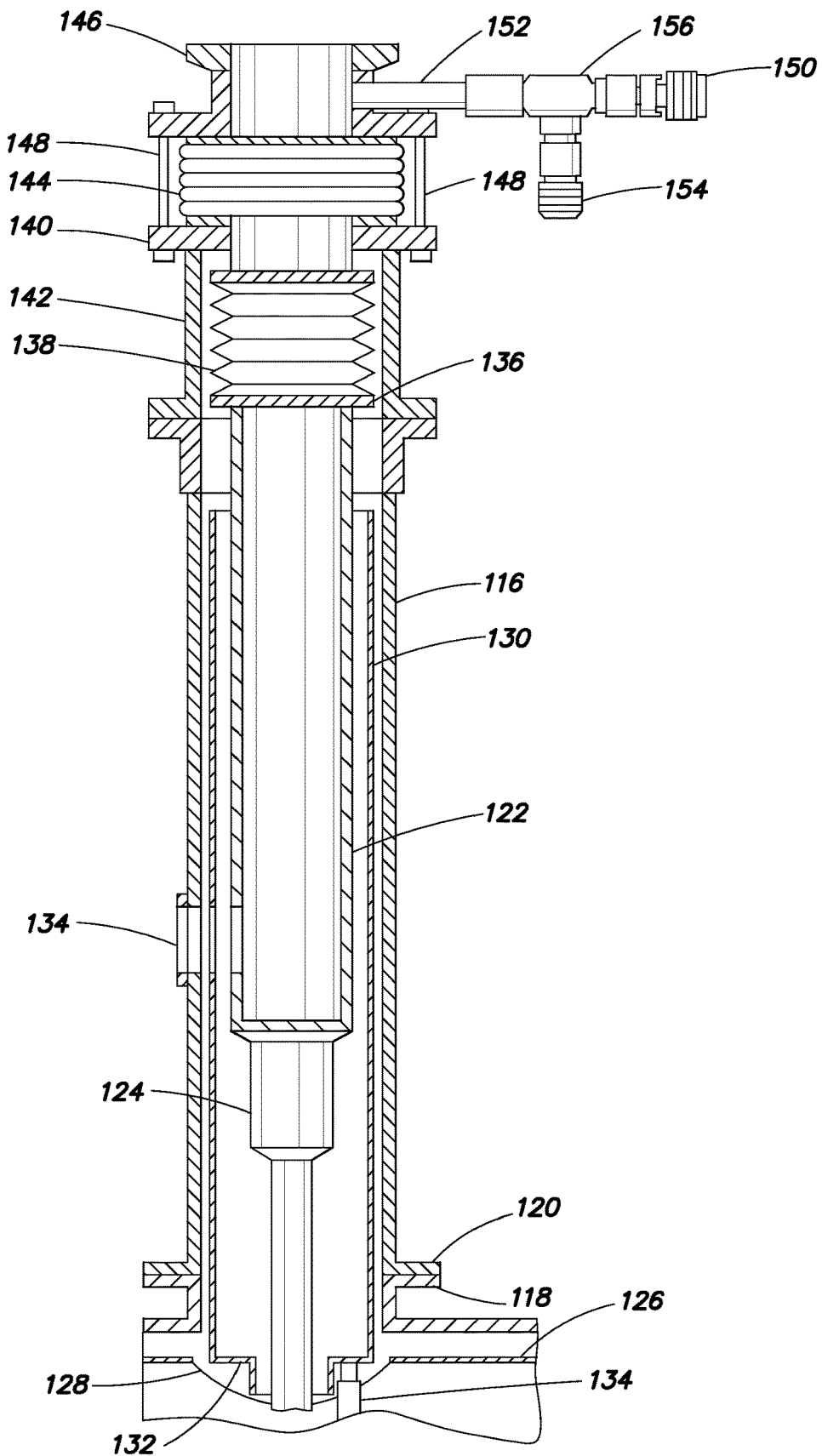
FIG. 2 is a cross-sectional diagram of the vertical portion of the cryostat.

In accordance with the principles of the invention, the vacuum shroud 108 has a vertical extension 116, which houses a sample well and sample as discussed further in detail below and is shown in more detail in the cross-sectional diagram shown in FIG. 2. Extension 116 may have either a hollow rectangular or cylindrical cross-section and is bolted to the shroud 108 via flanges 118 and 120. The vacuum shroud extension 116 encloses a sample well 122, which is constructed from a conductive material in the shape of an elongated cup. The sample well 122 is thermally connected to the cryocooler second stage 106 via a thermally-conductive sample well extension 124 which extends through a hole 128 in radiation shield 126. The sample well 122 is itself surrounded by a sample well radiation shield 130 (not shown in FIGS. 1A and 1b for clarity) which also extends through hole 128. The lower end 132 of the radiation shield 130 is attached to, and thermally anchored with, the first stage 104 of the cryocooler 102 using either a solid link connection 134 or a flexible link that has high thermal conductivity. Radiation shield link 134 has a flexible joint 136 to accommodate thermal contraction and expansion and mechanically supports the radiation shield 130. The other end of the radiation shield 130 extends to the upper part of the sample well 122 as shown in FIG. 2. The radiation shield 130 intercepts the heat load that is conducted from the upper warmer part of the sample well 122 to the colder part of the sample well 122.

The sample well 122, the sample well radiation shield 130 and the vacuum shroud extension 116 all have a window 135 that allows a laser beam to be applied to the sample.

The sample well assembly 122 uses a double bellows setup. A thin metal bellows 138 connects the sample well 122 to a vacuum housing interface flange 140 that is at room temperature and forms part of a vacuum housing extension 142 that bolts to the vacuum housing 116 to form a vacuum chamber enclosing the sample well 122. The bellows 138 allows the assembly flexibility for alignment and helps to reduce the conductive heat load from the interface flange 140 to the sample well 122.

Another soft flexible rubber bellows 144 is mounted between the interface flange 140 and a flange assembly 146 that is clamped to the sample stick (not shown in FIG. 2). During the installation and transportation of the cryostat, four support posts, of which two 148 are shown, are removably attached between the sample stick interface flange 146 and the vacuum housing flange 140. The support posts 148 keep the sample stick interface flange 146 stable and are removed during operation.

A helium inlet fitting 150 is connected via a tee fitting 156 to a helium inlet tube 152 that communicates with the interior of the sample stick interface flange 146 and, in turn, with the interior of the sample well 122. The helium inlet tube 152 allows the sample well 122 to be filled with gaseous helium. During experiments, the pressure of the helium in the sample well 122 is maintained at 3.44 kPa to 6.89 kPa (0.5 psi to 1 psi) by a relief valve 154 which is attached to tee fitting 156. The sample well 122 is cooled by the cryocooler 102 and cools the gaseous helium, which, in turn, cools the sample (not shown in FIG. 2).

Figure 3:
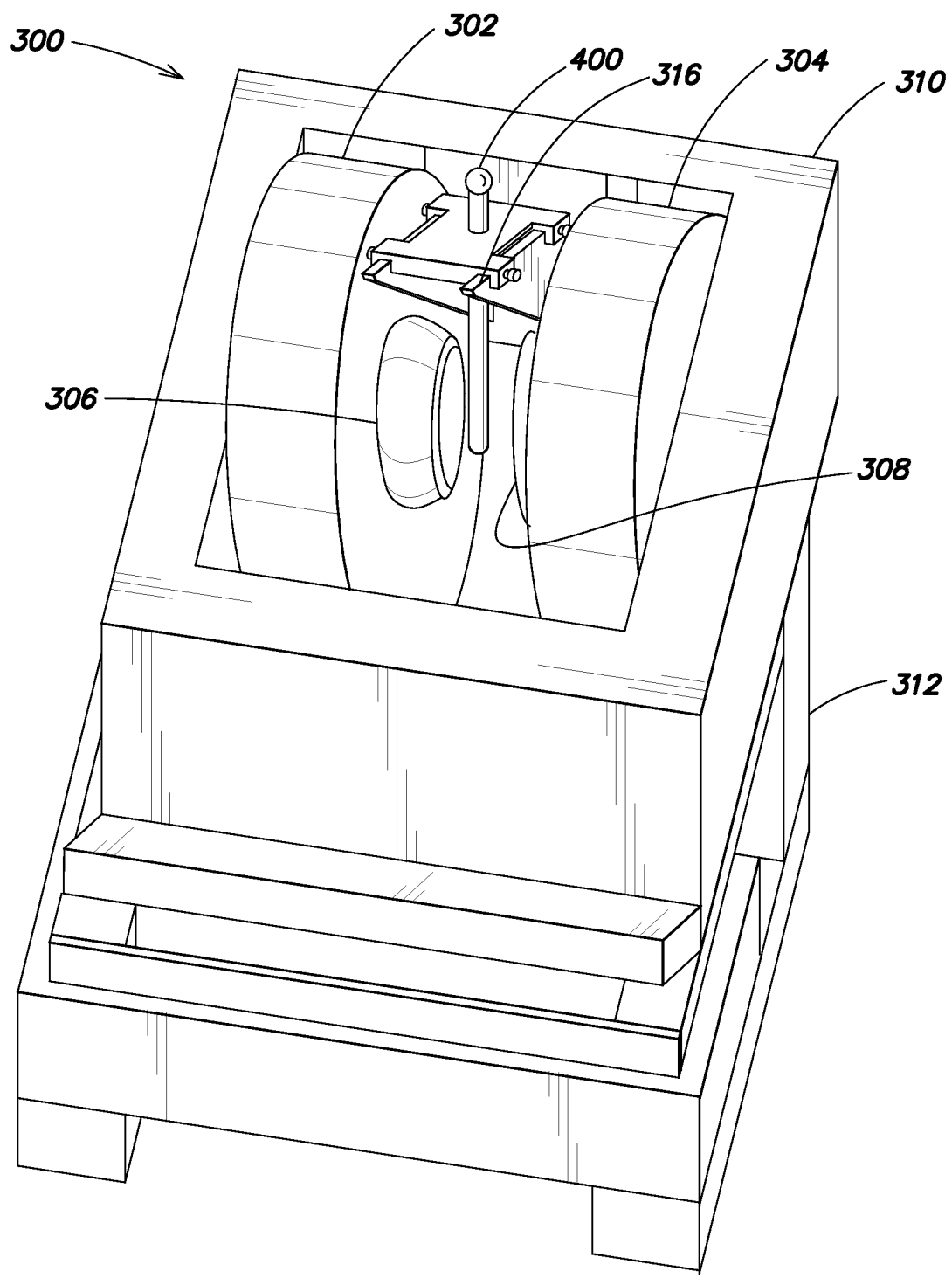
FIG. 3 is a perspective diagram of an EPR magnet assembly showing an EPR probe mounted on a bracket attached to the magnet frame.
Figure 4:
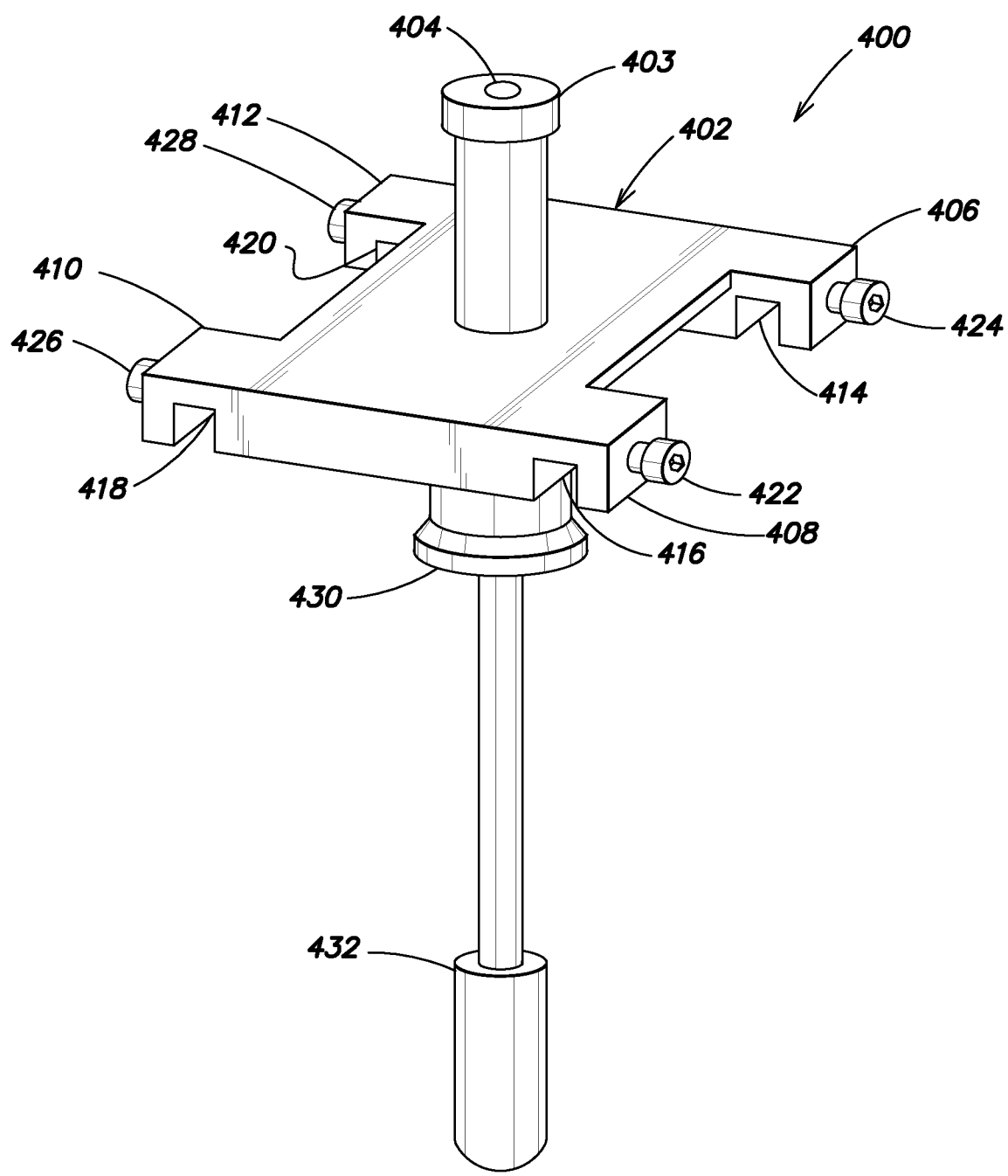
FIG. 4 is an enlarged view of a probe with a mounting assembly.

FIGS. 3 and 4 show the EPR magnet and sample stick assembly in more detail. A typical EPR magnet assembly 300 is shown in FIG. 3 and consists of a pair of electromagnets 302 and 304 with pole caps 306 and 308. Magnets 302 and 304 are, in turn, supported by magnet frame 310 which rests on stand 312.

The sample stick assembly 400 is schematically shown in FIG. 4. Conventional parts of the assembly have been omitted for clarity. A mounting plate 402 is used, as described below to mount the sample stick assembly 400 on the magnet frame 310. The sample stick assembly 400 has a sample holder 403 which accepts a sample that is typically placed in a long quartz tube (not shown). The tube is inserted into a hole 404 in the sample holder 403 and extends to near the end 432 of the sample stick assembly.

The mounting plate 402 has four arms 406-412, each of which has a slot 414-420, respectively. The slots 414-420 fit onto the arms of a bracket 316 shown in FIG. 3. Once in proper position, the sample stick assembly can be locked in place by means of four knobs 422-428 that tighten screws against the bracket arms. The sample stick assembly also includes a sample stick flange 430 which mates with the sample stick interface flange 146 on the cryostat.

During experiments, the cryostat assembly shown in FIGS. 1A, 1B and 2 is positioned on the floor beneath the magnets 302 and 304 with the sample well 122 extending upwards between the pole caps 306 and 308. The sample stick assembly 400 is then inserted into the sample well 122 and is supported on, and affixed to, the bracket 316, which is, in turn, attached to the frame 310. Once the sample stick assembly is properly aligned, the flanges 146 and 430 are clamped together and the four support posts 148 are removed leaving the cryostat connected to the sample stick assembly only by the flexible rubber bellows 144. The bellows 144 isolate the sample stick assembly 400 from any vibration induced by the closed cycle cryocooler 102. Ultra low vibration in the nanometer range can be achieved using this method.

The inventive design employs several unique features. The vacuum housing 116 is sized to fit between magnet pole caps 306 and 308 that are set 55 to 57 mm apart. The size also allows a hall sensor to be mounted on the pole caps 306 and 308 without any physical interference. In one embodiment, the inner diameter of the sample well 122 is 40 to 43 mm diameter and is designed to accept existing sample stick sizes. The physical dimensions of the cryostat provide for the highest magnetic field and sensitivity during experiments and can operate with narrow EPR magnet pole spacings of 55 mm. This design allows researchers to run long-term experiments, to simplify the logistics of using liquid helium dewars in the laboratory, to simplify and automate operation of the system and to reduce longer term operating costs.

While the invention has been shown and described with reference to a number of embodiments thereof, it will be recognized by those skilled in the art that various changes in form and detail may be made herein without departing from the spirit and scope of the invention as defined by the appended claims.

What is claimed is:

1. An ultra-low vibration cryogen-free cryostat for an electron paramagnetic resonance system having a pair of opposing magnets for use with a closed cycle cryocooler, the cryostat comprising:
    an elongated, cup-shaped sample well thermally connected to the cryocooler and into which gaseous helium is introduced;
    a sample stick assembly that holds a sample and is disposed in the sample well;
    a support mechanism that mechanically aligns the sample stick assembly with the magnets; and
    a flexible rubber bellows connecting the sample stick assembly to the sample well so that vibration generated by the cryocooler is not transferred to the sample.

2. The cryostat of claim 1 wherein the cryocooler has a first stage and a second stage located along a cryocooler axis and wherein the cryostat further comprises a hollow vacuum shroud that extends perpendicularly to the cryocooler axis and between the magnets.

3. The cryostat of claim 2 further comprising a thermal radiation shield surrounding the sample well and located inside the vacuum shroud.

4. The cryostat of claim 3 further comprising a thermally conducting link connected between the radiation shield and the cryocooler first stage.

5. The cryostat of claim 2 wherein the vacuum shroud has an outer dimension less than 55 mm in an area between the magnets.

6. The cryostat of claim 1 wherein the support mechanism comprises a bracket mechanically attached to the magnets.

7. The cryostat of claim 1 further comprising a sample stick interface flange connected to the bellows and a clamp for clamping the interface flange to the sample stick assembly.

8. The cryostat of claim 1 wherein the rubber bellows is connected between an upper flange and the sample well and the cryostat further comprises a plurality of removable support posts extending between the upper flange and the sample well that hold the flange in position during assembly and are removed during cryostat operation.

9. The cryostat of claim 8 wherein the sample stick has a flange that mates with the upper flange and is clamped to the upper flange before the support posts are removed.

10. The cryostat of claim 1 wherein the sample well has an inner diameter of at least 40 mm.

11. An ultra-low vibration cryogen-free cryostat for an electron paramagnetic resonance system having a pair of opposing magnets, comprising:
    a closed cycle cryocooler having a first stage and a second stage located along a cryocooler axis;
    an elongated, cup-shaped sample well thermally connected to the cryocooler and into which gaseous helium is introduced;
    a sample stick assembly that holds a sample and is disposed in the sample well;
    a hollow vacuum shroud that extends perpendicularly to the cryocooler axis and between the magnets;
    a support mechanism that mechanically aligns the sample stick assembly with the magnets; and
    a flexible rubber bellows connecting the sample stick assembly to the sample well so that vibration generated by the cryocooler is not transferred to the sample.

12. The cryostat of claim 11 further comprising a thermal radiation shield surrounding the sample well and located inside the vacuum shroud and a thermally conducting link connected between the radiation shield and the cryocooler first stage.

13. The cryostat of claim 12 wherein the support mechanism comprises a bracket mechanically attached to the magnets.

14. The cryostat of claim 13 wherein the rubber bellows is connected between an upper flange and the sample well and the cryostat further comprises a plurality of removable support posts extending between the upper flange and the sample well that hold the flange in position during assembly and are removed during cryostat operation.

15. The cryostat of claim 14 wherein the sample stick has a flange that mates with the upper flange and is clamped to the upper flange before the support posts are removed.

* * * * *